US010165703B1

(12) United States Patent
Adrian (10) Patent No.: US 10,165,703 B1
(45) Date of Patent: Dec. 25, 2018

(54) DATA-CENTER DRAWER AND CABLE TRACK ASSEMBLY

(71) Applicant: Facebook, Inc., Menlo Park, CA (US)

(72) Inventor: Jason David Adrian, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/720,647

(22) Filed: Sep. 29, 2017

(51) Int. Cl.
*H02B 1/20* (2006.01)
*H05K 7/14* (2006.01)
*H05K 5/02* (2006.01)

(52) U.S. Cl.
CPC ......... *H05K 7/1491* (2013.01); *H05K 5/0247* (2013.01); *H05K 7/1435* (2013.01); *H05K 7/1489* (2013.01); *H05K 7/1492* (2013.01)

(58) Field of Classification Search
CPC .. H05K 7/1491; H05K 7/0247; H05K 7/1435; H05K 7/1489; H05K 7/1492
USPC .......................................................... 361/826
See application file for complete search history.

(56) References Cited

U.S. PATENT DOCUMENTS

| | | | | |
|---|---|---|---|---|
| 5,724,803 | A * | 3/1998 | Pea | F16G 13/16 248/49 |
| 6,621,692 | B1 * | 9/2003 | Johnson | H05K 7/1421 312/223.1 |
| 9,070,419 | B1 * | 6/2015 | Zhu | H05K 7/1491 |
| 9,098,233 | B2 * | 8/2015 | Keffeler | G11B 33/128 |
| 9,101,210 | B2 * | 8/2015 | Lin | F16M 1/00 |
| 9,538,684 | B2 * | 1/2017 | Chen | H05K 7/1489 |
| 9,572,276 | B2 * | 2/2017 | Haroun | H05K 7/1485 |
| 9,763,350 | B2 * | 9/2017 | Rust | G11B 33/02 |
| 2007/0230111 | A1 * | 10/2007 | Starr | G11B 33/125 361/679.31 |
| 2012/0134086 | A1 * | 5/2012 | Zhang | G06F 1/181 361/679.02 |

OTHER PUBLICATIONS

Acoustic Attenuation; https://en.wikipedia.org/wiki/Acoustic_attenuation; Oct. 22, 2012.
Electromagnetic Shielding; https://en.wikipedia.org/wiki/Electromagnetic_shielding; May 15, 2016.

(Continued)

*Primary Examiner* — Hung S Bui
(74) *Attorney, Agent, or Firm* — FisherBroyles, LLP (57) ABSTRACT

A data-center drawer may include an outerassembly that is removably attached to a data-center rack and an inner assembly that (1) houses at least one computing component and (2) is configured to extend between (a) a closed position in which the inner assembly is enclosed within the outer assembly and (b) an open position in which the inner assembly is at least partially extended from the outer assembly. The data-center drawer may also include a cable track, positioned within the inner assembly, that houses at least one cable that provides connectivity to the computing component. The cable track may (1) at least partially fold upon itself as the inner assembly moves from the open position to the closed position and (2) at least partially unfold as the inner assembly extends from the closed position to the open position. Corresponding systems and methods of assembly are also disclosed.

20 Claims, 7 Drawing Sheets

(56) References Cited

OTHER PUBLICATIONS

Jason David Adrian et al.; Apparatus, System, and Method for Reconfigurable Media-Agnostic Storage; U.S. Appl. No. 15/694,068, filed Sep. 1, 2017.
Jason David Adrian; Apparatus, System, and Method for Indicating the Status of and Securing Hard Drives; U.S. Appl. No. 15/700,112, filed Sep. 9, 2017.
Jason David Adrian; Apparatus, System, and Method for Directing Air in a Storage-System Chassis; U.S. Appl. No. 15/689,650, filed Aug. 29, 2017.
Jason David Adrian et al.; Apparatus, System, and Method for Enabling Multiple Storage-System Configurations; U.S. Appl. No. 15/688,830, filed Aug. 28, 2017.
Jason David Adrian et al.; Apparatus, System, and Method for Securing Hard Drives in a Storage Chassis; U.S. Appl. No. 15/697,405, filed Sep. 6, 2017.
Jason David Adrian; Apparatus, System, and Method for Detecting Device Types of Storage Devices; U.S. Appl. No. 15/698,540, filed Sep. 7, 2017.
Chuankeat Kho et al.; Removeable Drive-Plane Apparatus, System, and Method; U.S. Appl. No. 15/693,362, filed Aug. 31, 2017.
Chuankeat Kho et al.; Systems and Methods for Mounting Assembly Pull-Handles; U.S. Appl. No. 15/687,406, filed Aug. 25, 2017.
Jason David Adrian; An Apparatus, System, and Method for Reconfiguring Air Flow Through a Chassis; U.S. Appl. No. 15/716,251, filed Sep. 26, 2017.
Jason Adrian; Introducing Bryce Canyon: Our next-generation storage platform; https://code.facebook.com/posts/1869788206569924/introducing-bryce-canyon-our-next-generation-storage-platform/; Mar. 8, 2017.
Jason Adrian et al.; Bryce Canyon Storage Specification; Jan. 31, 2017.
Open Compute Project; http://opencompute.org/; as accessed Sep. 29, 2017.
Chuankeat Kho; Apparatus, System, and Method for Securing Computing Components to Printed Circuit Boards; U.S. Appl. No. 15/713,607, filed Sep. 23, 2017.
Chuankeat Kho et al.; Apparatus, System, and Method for Partitioning a Storage-System Chassis; U.S. Appl. No. 15/708,069, filed Sep. 18, 2017.
Chuankeat Kho et al.; Apparatus, System, and Method for Dampening Vibrations Generated by Exhaust Fans; U.S. Appl. No. 15/713,609, filed Sep. 23, 2017.
Chuankeat Kho et al.; Apparatus, System, and Method for Resisting Shock to a Data-Center Rack; U.S. Appl. No. 15/708,075, filed Sep. 18, 2017.

* cited by examiner

DATA-CENTER DRAWER AND CABLE TRACK ASSEMBLY

BACKGROUND

Data centers are some of the most important and complex communications-infrastructure environments in the world. Data centers may have hundreds, or even thousands, of discrete power modules, computing components, and storage devices that are powered and interconnected via various types of cables. Some of this cabling may run between data-center racks and may be carefully organized for aesthetic, safety, and maintenance reasons. Other cabling may be housed within data-center racks and drawers, and while not as readily visible as exterior cabling, enclosed cabling must still be carefully maintained and organized.

Unfortunately, many traditional cable-management systems are often primarily designed for cabling outside of racks and/or may be inadequate for organizing cables inside of data-center drawers. For example, as data-center drawers open and close, cabling may be stressed or may become tangled and jumbled over time. These cables may even be pulled loose or become completely disconnected, which ray result in connectivity and safety issues. The instant disclosure, therefore, identifies and addresses a need for more efficient and effective systems and methods for managing cables within data-center drawers and racks.

SUMMARY

As will be described in greater detail below, the instant disclosure describes various data-center drawers, data-center racks, and methods of assembling the same. In one example, a data-center drawer may include (1) an outer assembly configured to be removably attached to a data-center rack and (2) an inner assembly that houses at least one computing component and that is configured to extend between (a) a closed position in which the inner assembly is enclosed within the outer assembly and (b) an open position in which the inner assembly is at least partially extended from the outer assembly. The data-center drawer may also include a cable track, positioned within the inner assembly, that is dimensioned to house at least one cable that provides connectivity to the computing component. In this example, the cable track may be configured to (1) at least partially fold upon itself as the inner assembly moves from the open position to the closed position and (2) at least partially unfold as the inner assembly extends from the closed position to the open position.

In some examples, the cable track may include (1) a plurality of link segments, coupled end-to-end, that together define a channel dimensioned to house the cable, (2) a proximal end anchored to the inner assembly, and (3) a distal end anchored to the outer assembly. In these examples, each link segment may be coupled to at least one other link segment via a pivot point. In addition, when the inner assembly is in the closed position and the cable track is at least partially folded upon itself, at least one link segment of the cable track may be vertically superior to at least one other link segment.

In one embodiment, the cable track may be configured to fold and unfold about a single axis. In this embodiment, the single axis about which the cable track folds and unfolds may include a horizontal axis that is perpendicular to a horizontal plane along which the inner assembly travels when moving from the closed position to the open position.

The cable track may be formed from a variety of materials, such as metal and/or plastic. The cable track may also house a variety of types of cables, such as a power cable that provides power to the computing component housed within the inner assembly, a data cable that provides data to the computing component housed within the inner assembly, and/or a grounding cable that grounds the computing component housed within the inner assembly. In examples where the cable represents a power cable, this powercable may include (1) a distal end electrically coupled to a bus bar clip that is attached to the outer assembly and (2) a proximal end electrically coupled to a printed circuit board that is attached to the inner assembly, where the printed circuit board electrically couples the computing component housed within the inner assembly to the power cable. In examples where the cable represents a grounding cable, this grounding cable may include (1) a distal end electrically coupled to the outer assembly via a grounding bolt and (2) a proximal end electrically coupled to a printed circuit board via a grounding screw, where the printed circuit board is attached to the inner assembly and electrically couples the computing component housed within the inner assembly to the grounding cable.

In one example, the inner assembly may include (1) a plurality of vertical support walls that together define at least one computing component bay that houses the computing component and (2) a plurality of vertical partition walls that together define a cable track bay that houses the cable track. In this example, the vertical support walls may define two lateral computing component bays and the vertical partition walls may define a single, medial cable track bay disposed between the two lateral computing component bays.

In one embodiment, a method for assembling a drawer assembly may include attaching an inner drawer assembly to an outer drawer assembly that is configured to be removably attached to a data-center rack. In this embodiment, the inner drawer assembly may house at least one computing component and may be configured to extend between (1) a closed position in which the inner drawer assembly is enclosed within the outer drawer assembly and (2) an open position in which the inner drawer assembly is at least partially extended from both the outer drawer assembly and the data-center rack. The method may also include (1) attaching a proximal end of a cable track to the inner drawer assembly and (2) attaching a distal end of the cable track to the outer drawer assembly. In this embodiment, the cable track may be dimensioned to house at least one cable that provides connectivity to the computing component and may be configured to (1) at least partially fold upon itself as the inner drawer assembly moves from the open position to the closed position and (2) at least partially unfold as the inner drawer assembly extends from the closed position to the open position.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and methods for using cable tracks to manage cables within data-center drawers. As will be explained in greater detail below, embodiments of the instant disclosure may involve housing one or more cables within a cable track that (1) folds upon itself as a data-center drawer closes and (2) unfolds as the data-center drawer opens. The cable tracks discussed herein may provide clean, safe, and/or compact cable management and, and as detailed below, may provide a variety of advantages over other procedures for managing cables within data-center drawers.

The following will provide, with reference to FIGS. 1-5 and 7, detailed descriptions of an exemplary data-center drawer, and a cable track disposed therein, and methods for assembling the same. A detailed description of an exemplary data-center rack into which the data-center drawer of FIGS. 1-5 may be inserted will also be provided in connection with FIG. 6.

Figure 1:
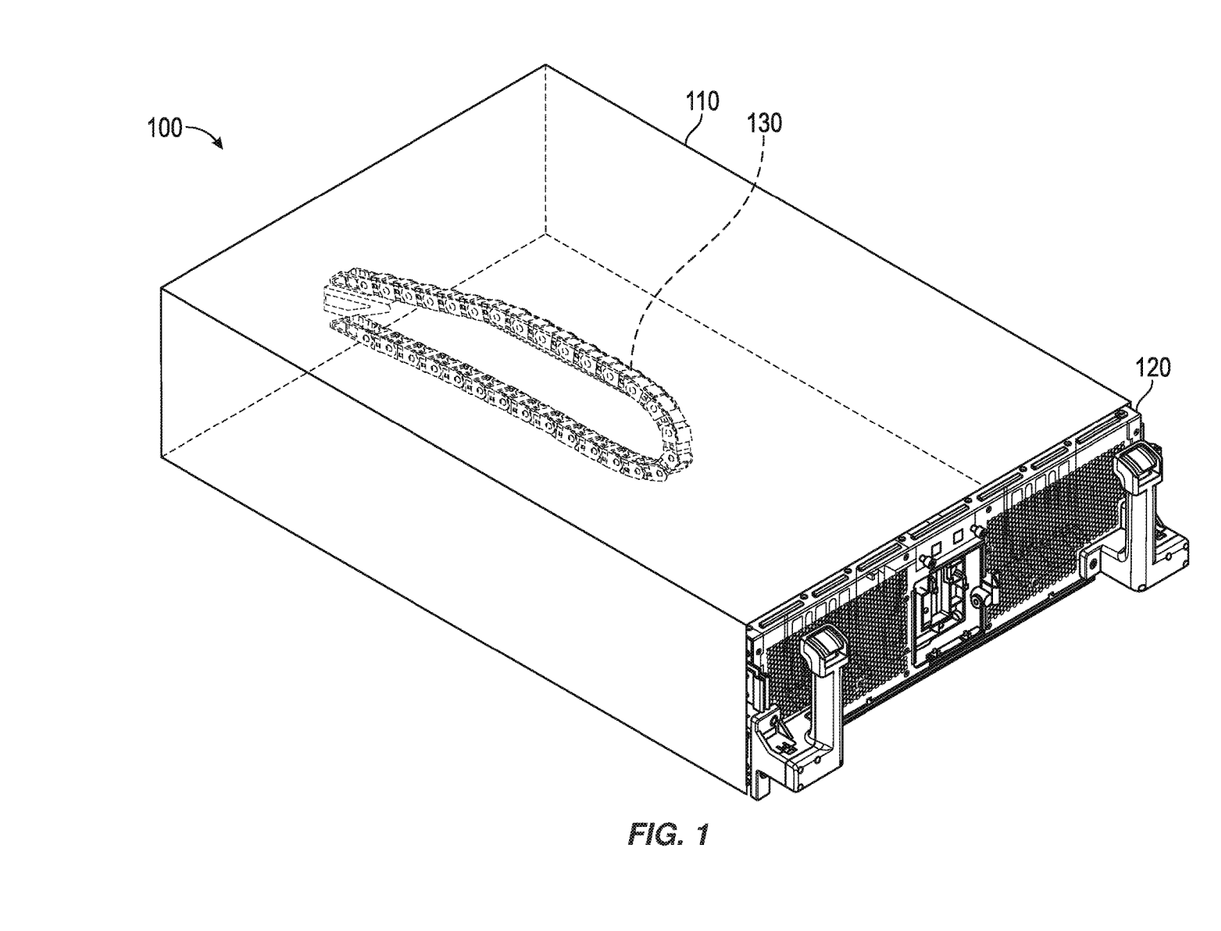
FIG. 1 is an isometric view of an exemplary data-center drawer, and cable track, in a closed position.
Figure 2:
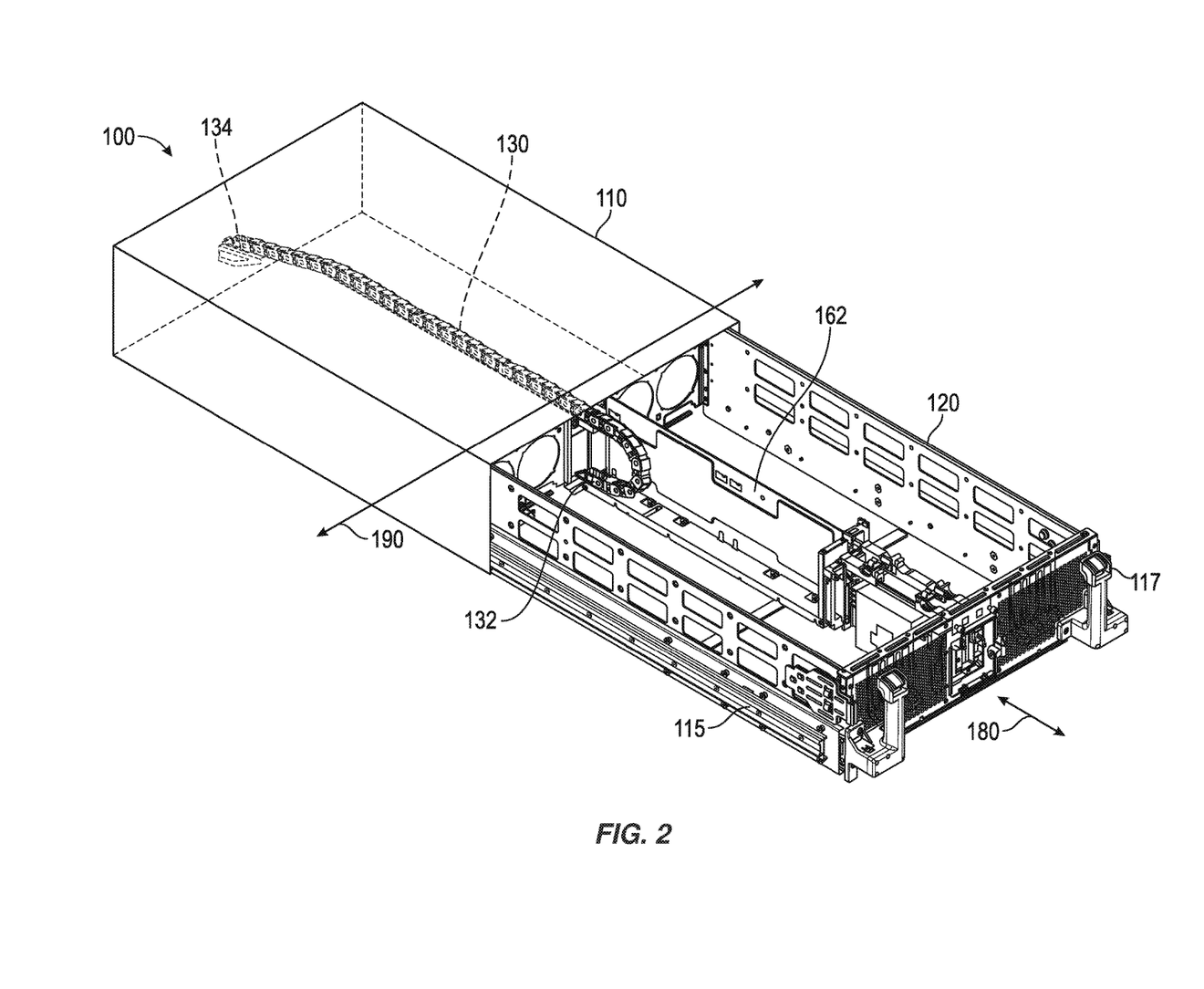
FIG. 2 is an isometric view of the data-center drawer from FIG. 1 in an open position.

FIGS. 1-2 are isometric views of an exemplary data-center drawer 100. The term "data-center drawer," as used herein, generally refers to any type or form of physical enclosure for computing components designed to be removably inserted within a data-center rack (such as data-center rack 600 illustrated in FIG. 6). In one embodiment, and as illustrated in FIGS. 1-2, data-center drawer 100 may include both an outer assembly 110 and an inner assembly 120. In this embodiment, inner assembly 120 may be dimensioned so as to be removably housed within outer assembly 110. For example, inner assembly 120 may be configured to extend between (1) a closed position in which inner assembly 120 is fully enclosed within outer assembly 110 (as shown in FIGS. 1) and (2) an open position in which inner assembly 120 is at least partially extended from outer assembly 110 (as shown in FIG. 2). In this example, a technician or other user may extend inner assembly 120 from outer assembly 110 of data-center drawer 100 (and thus from a data-center rack) by grasping pull handles 117 and exerting an outward force against the same, which may in turn cause inner assembly 120 to extend from outer assembly 110 along a horizontal plane 180 (shown in FIG. 2) via slide rail assembly 115.

Figure 6:
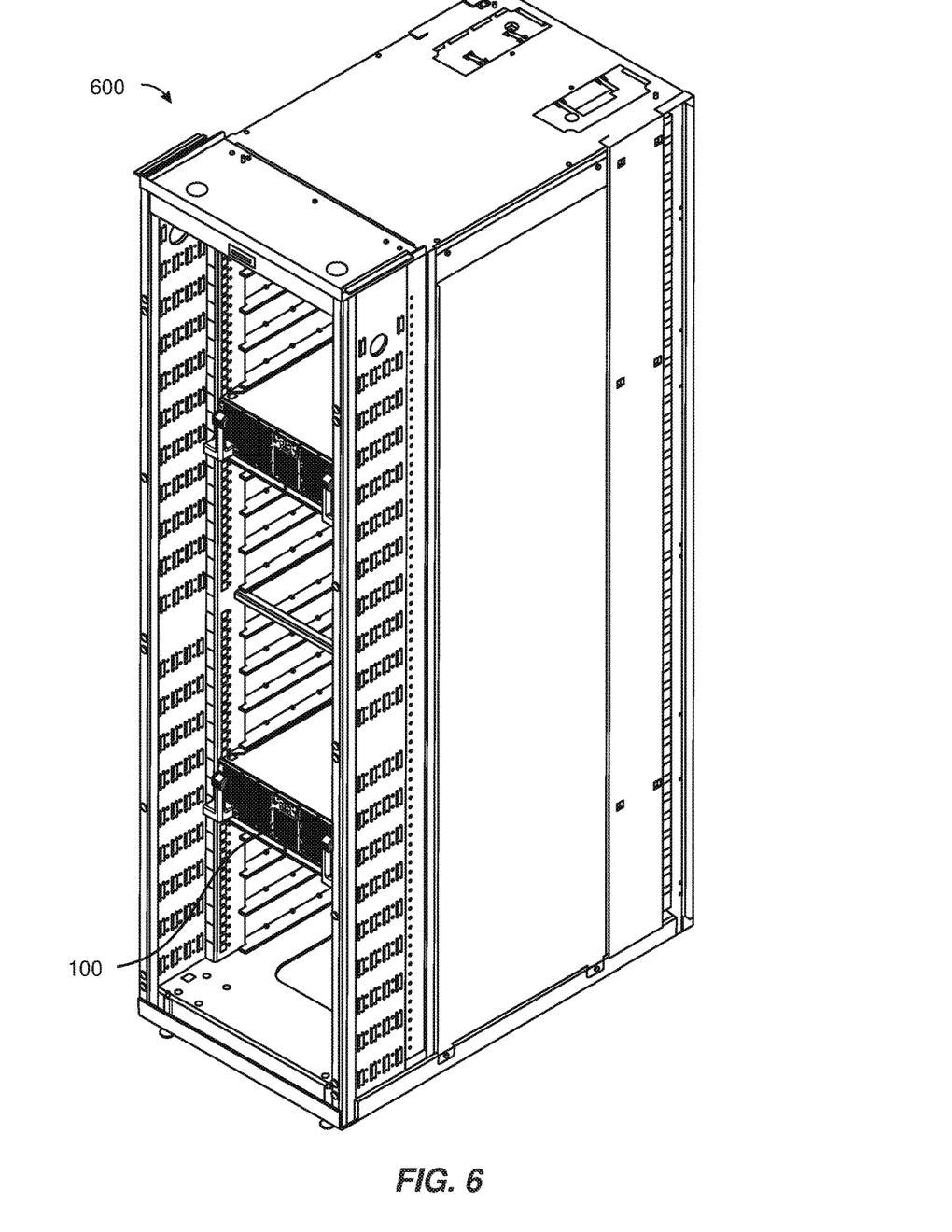
FIG. 6 is an isometric view of an exemplary drawer assembly inserted into a data-center rack.

In some examples, data-center drawer 100 may be dimensioned to be removably inserted into a data-center rack, such as data-center rack 600 in FIG. 6. In these examples, outer assembly 110 may be configured to be removably attached to the data-center rack via one or more mounting structures, such as support shelves, mounting holes defined within the rack's vertical support bars, posts and/or screws, brackets, etc.

In one example, inner assembly 120 of data-center drawer 100 may be configured to house at least one computing component. The phrase "computing component," as used herein, generally refers to any type or form of element capable of performing (or required to perform) a computing task. Examples of computing components include, without limitation, processors, memory devices, storage devices, power supplies, networking devices, modular variations and/or combinations of one or more of the same, and the like. For example, and as illustrated in the top-down view of FIG. 4, inner assembly 120 may be configured to house a plurality of storage devices 145.

Outer assembly 110 and inner assembly 120 may be formed in a variety of shapes and sizes using a variety of materials. In some examples, inner assembly 120 may include a plurality of vertical support walls and a plurality of vertical partition walls that together define (1) at least one computing component bay dimensioned to house computing components (such as storage devices 145) and (2) a cable track bay dimensioned to house a cable track (as detailed below). For example, and as illustrated in the top-down view of FIG. 4, vertical support walls 122 may, together with partition walls 162, define lateral computing component bays 140 and 150 and a single, medial cable track bay 160 disposed between lateral computing component bays 140 and 150.

Figure 3:
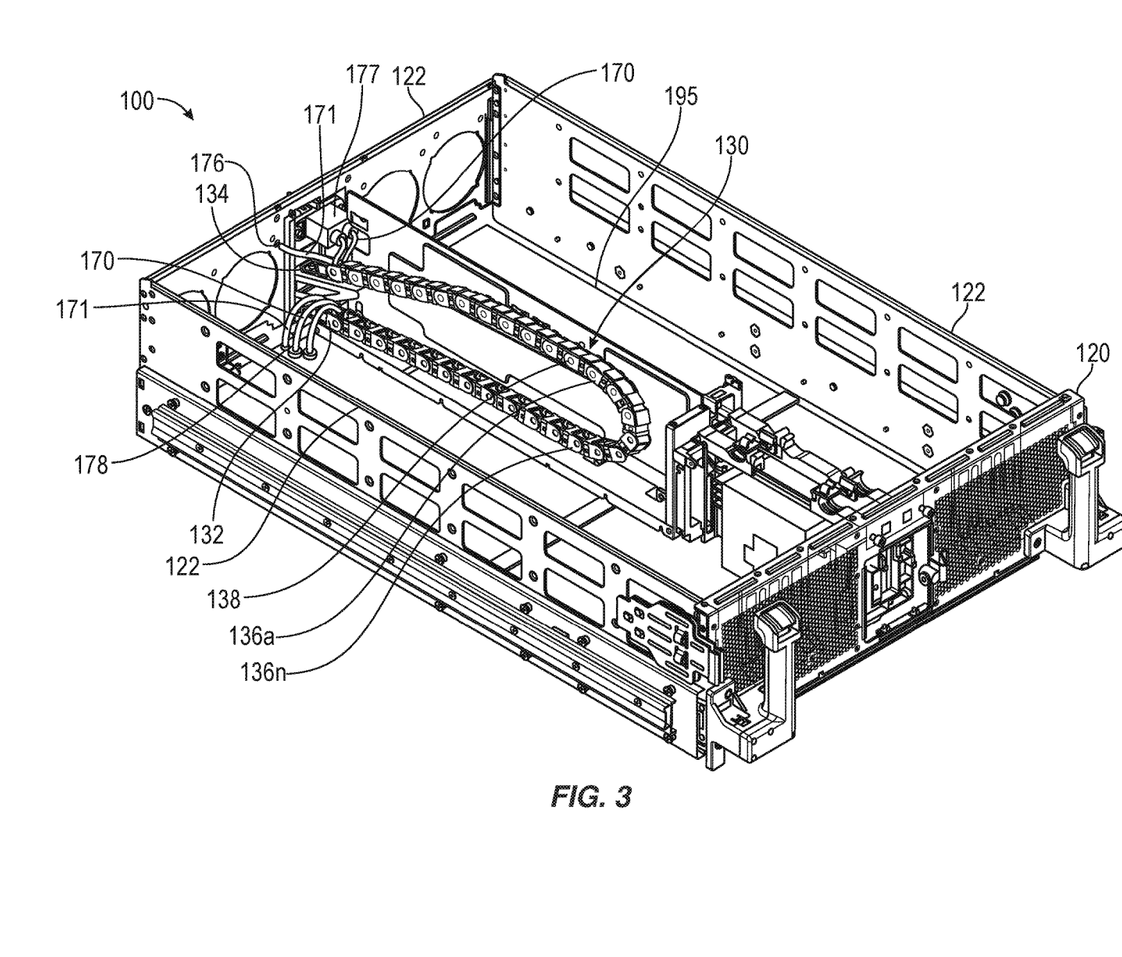
FIG. 3 is an isometric view of an inner drawer assembly.
Figure 4:
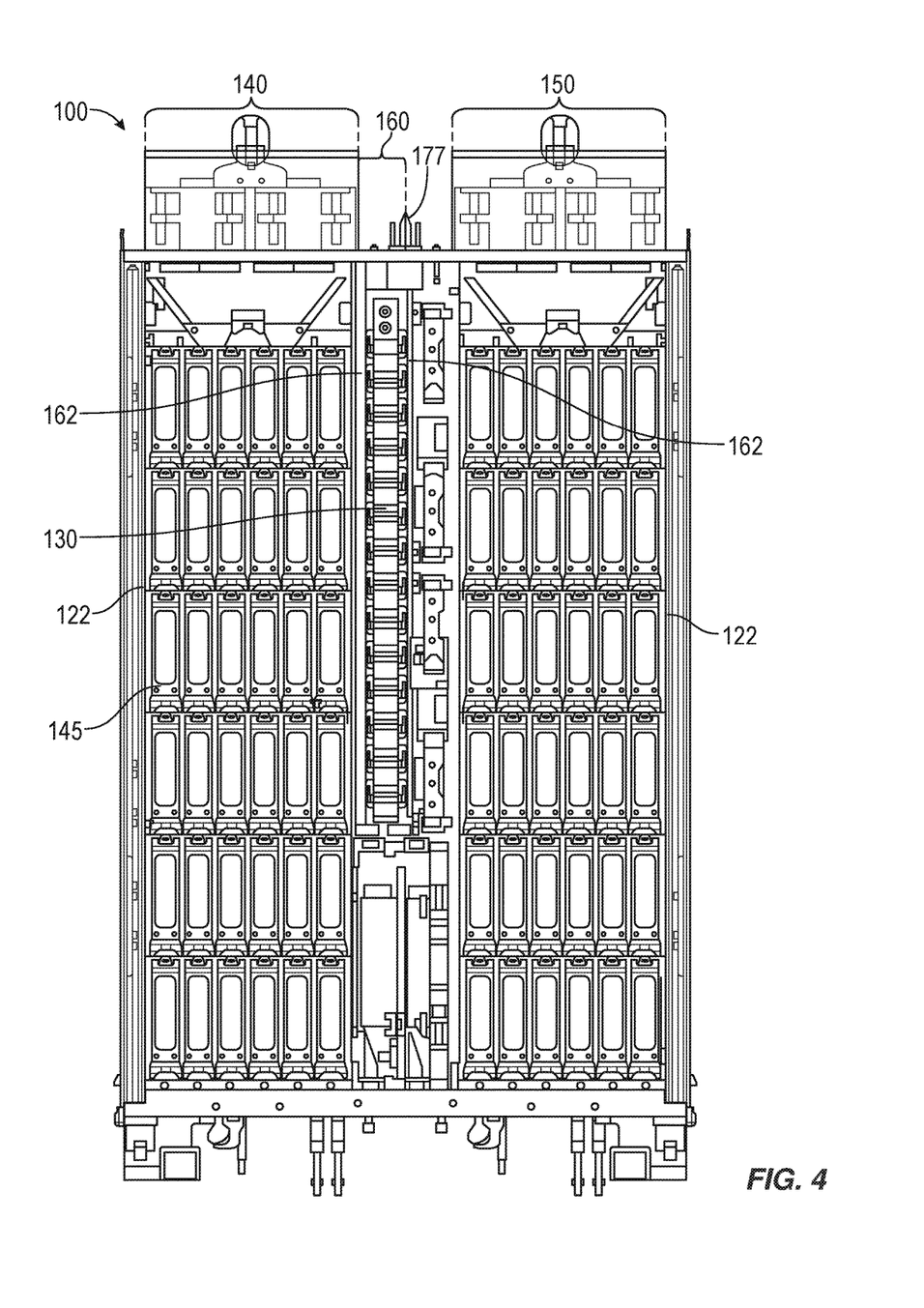
FIG. 4 is a top view of an exemplary data-center drawer and cable track.

As shown in both FIGS. 1-2 and in the isometric view of inner assembly 120 in FIG. 3, data-center drawer 100 may also include a cable track 130 at least partially disposed within inner assembly 120. The phrase "cable track," as used herein, generally refers to any type or form of physical enclosure capable of housing one or more cables that provide connectivity (e.g., data and/or power) to computing components within data-center drawers (such as data-center drawer 100). Cable track 130 may be formed in any of a variety of shapes and sizes and formed of any number of suitable materials, including, for example, metal (e.g., steel, aluminum, etc.), plastic (e.g., heat- and/or chemical-resistant plastic), and the like. In one example, cable track 130 may be disposed within cable track bay 160.

Cable track 130 may be coupled to outer assembly 110 and/or inner assembly 120 in a variety of ways. In one example, and as best shown in FIG. 2, a proximal end 132 of cable track 130 may be anchored to inner assembly 120 and a distal end 134 of cable track 130 may be anchored to outer assembly 110. In this example, these anchor points may enable cable track 130 (and the cables housed therein) to fully and safely extend when inner assembly 120 moves from the closed position shown in FIG. 1 to the open position shown in FIG. 2. In some embodiments, both these anchor points and the length of cable track 130 may prevent any cables housed within cable track 130 from experiencing undo tension due to inner assembly 120 moving from a closed position to an open position. For example, the length of cable track 130 may be shorter than that of any cables housed therein so that the anchor points and structure of cable track 130, and not any cables housed therein, will experience (and thus absorb) the majority of any tension generated during movement of inner assembly 120.

In some examples, and as shown in FIG. 3, cable track 130 may be formed of a plurality of link segments 136a-136n, coupled end-to-end, that together define a channel dimensioned to house one or more cables. In these examples, each link segment may be coupled to at least one other link segment via a pivot pin 138. In one embodiment, pivot pin 138 may enable link segments 136a-136n to rotate relative to one another about a single, fixed axis (such as axis 190 shown in FIG. 2). As shown in FIGS. 1-2, this rotational relationship may, in turn, enable cable track 130 to (1) at least partially fold upon itself as inner assembly 120 moves from the open position shown in FIG. 2 to the closed position shown in FIG. 1 and, in turn, (2) at least partially unfold as inner assembly 120 extends from the closed position in FIG. 1 to the open position shown in FIG. 2.

As detailed above, in one embodiment cable track 130 may be configured to fold and unfold about a single axis, such as axis 190 in FIG. 2. In this embodiment, the axis about which cable track 130 folds and unfolds may represent a horizontal axis that is perpendicular to a horizontal plane (e.g., horizontal plane 180) along which inner assembly 120 travels (via, e.g. slide rail assembly 115) when moving from a closed position to an open position.

In one example, when inner assembly 120 is in the closed position and cable track 130 is at least partially folded upon itself, at least one link segment of cable track 130 may be vertically superior to at least one other link segment. For example (and as best shown in FIG. 3), link segment 136a may, when cable track 130 is folded upon itself, be positioned in a vertically superior position relative to link segment 136n.

Cable track 130 may be dimensioned to house any number and/or variety of cables. Examples of such cables include, without limitation, power cables (e.g., 12V cables) that provide power to computing component(s) housed within inner assembly 120, data cables (e.g., component or board interconnect cables, network connectivity cables, etc.) that provide data to computing component(s) housed within inner assembly 120, grounding cables that ground computing component(s) housed within inner assembly 120, etc. For example, and as shown in FIG. 3, cable track 130 may be configured to house both a power cable 170 and a grounding cable 171.

As shown in FIG. 3, grounding cable 171 may include both (1) a distal end electrically coupled to outer assembly 110 via a grounding bolt 176 and (2) a proximal end electrically coupled to printed circuit board 195 (e.g., a drive plane board) via a grounding screw 178. In this example, grounding cable 171 may electrically couple (and thus ground) computing components connected to printed circuit board 195 via grounding bolt 176, which may be inserted within outer assembly 110.

Figure 5:
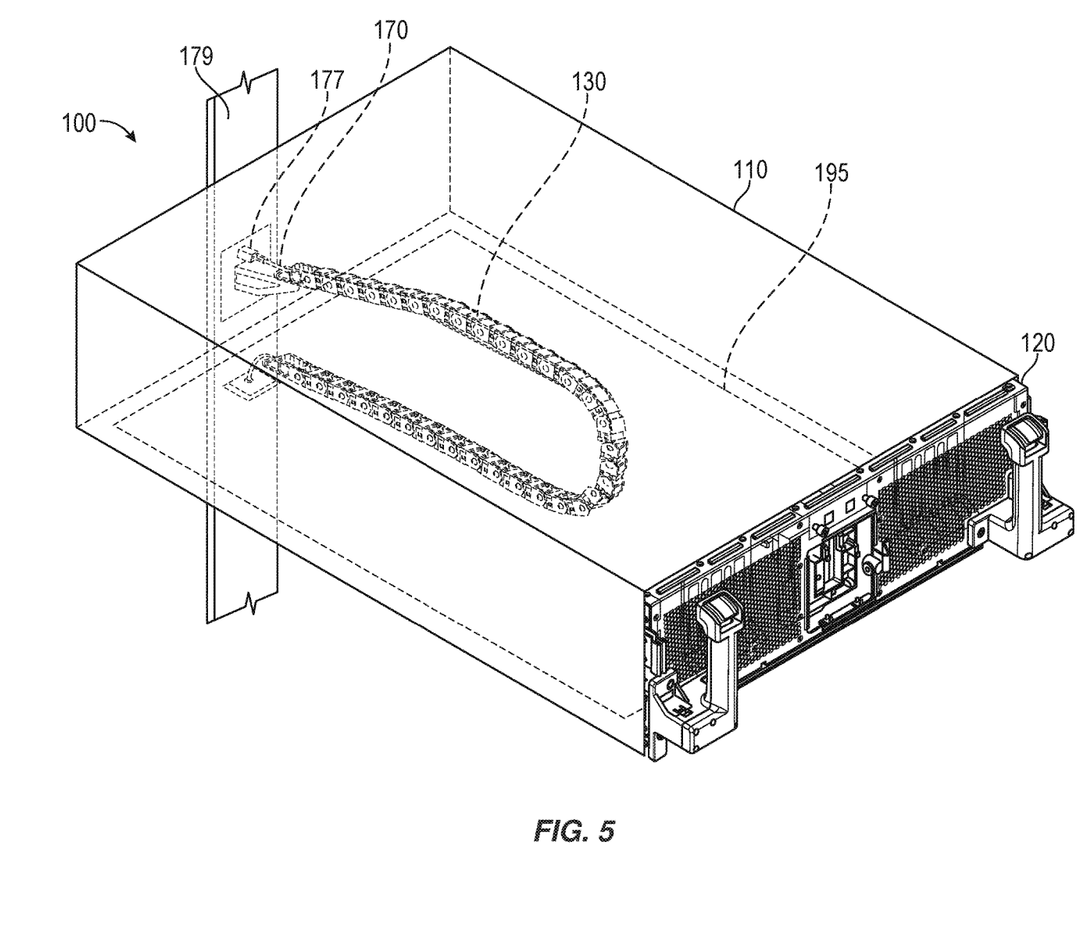
FIG. 5 is an isometric view of an exemplary data-center drawer, connected to a bus bar, in a closed position.

Similarly, as shown in the isometric view of FIG. 5, power cable 170 may include both (1) a distal end electrically coupled to a bus bar clip 177 that is attached to outer assembly 110 and (2) a proximal end electrically coupled to a printed circuit board 195 that is attached to inner assembly 120. In this example, bus bar clip 177 may be configured to electrically couple (via, e.g., a blind-mate connection) with a bus bar 179 at the back of a data-center rack, such as data-center rack 600 shown in FIG. 6, designed to provide power to computing components within data-center drawer 100. As such, power cable 170 may provide power (e.g., 12V power) from bus bar 179 to at least one computing component (e.g., storage devices 145) housed within inner assembly 120 via printed circuit board 195.

Figure 7:
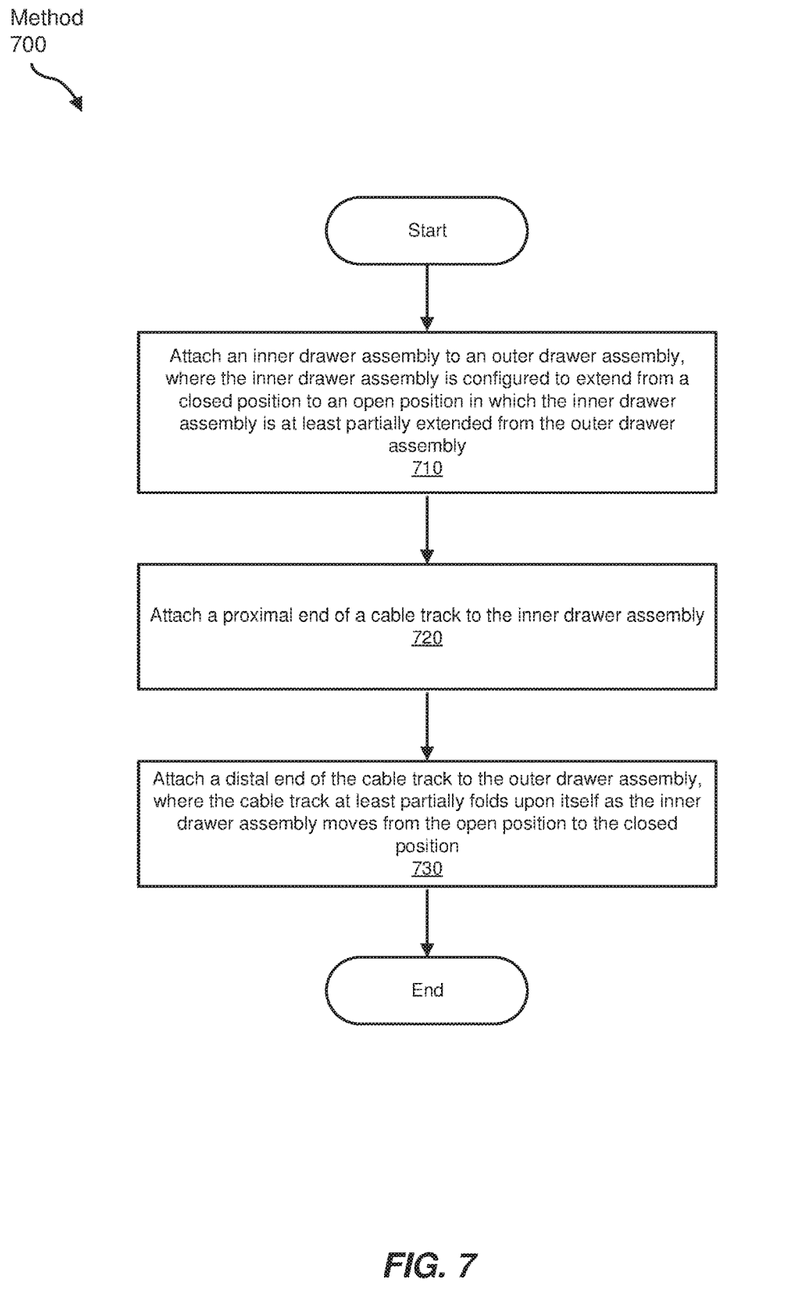
FIG. 7 is a block diagram of an exemplary method for assembling a data-center drawer.

FIG. 7 is a flow diagram of an exemplary method for manufacturing, assembling, using, adjusting, or otherwise configuring or creating a cable track in a data-center drawer. The steps shown in FIG. 7 may be performed by any individual and/or by any suitable type or form of manual and/or automated apparatus. Specifically, FIG. 7 illustrates a flow diagram of an exemplary method 700 for assembling a cable track in a data-center drawer.

As shown in FIG. 7, at step 710, the systems described herein may attach an inner drawer assembly (such as inner assembly 120) to an outer drawer assembly (such as outer assembly 110). In one example, the process of attaching the inner drawer assembly to the outer drawer assembly may involve configuring the inner drawer assembly to extend from a closed position to an open position. As detailed above, in the closed position, the inner drawer assembly may be partially or completely enclosed within the outer drawer assembly. In the open position, the inner drawer assembly may be partially or completely extended from the outer drawer assembly and/or a data-center rack (such as data-center rack 600).

The inner drawer assembly may be attached to the outer drawer assembly in any suitable manner. For example, a slide rail assembly (such as slide rail assembly 115) may movably couple the outer drawer assembly to the inner drawer assembly. In this example, a rail may be attached to the outer drawer assembly and a slide may be attached to the inner drawer assembly such that moving the slide along the rail moves the inner drawer assembly relative to the outer drawer assembly. A slide may be attached to the outside of either or both sides of the inner drawer assembly, and a corresponding rail may be attached to the inside of either or both sides of the outer drawer assembly. Additionally or alternatively, one or more slides may be affixed to the underside of the inner drawer assembly, and one or more corresponding rails may be affixed to the floor of the outer drawer assembly. The systems and methods described herein may also use any other type or form of movement mechanism to attach the outer drawer assembly to the inner drawer assembly.

At step 720, the systems described herein may attach a proximal end of a cable track (such as proximal end 132 of cable track 130) to the inner drawer assembly. Any of a variety of mechanisms and/or procedures may be used to attach the proximal end of the cable track to the inner drawer assembly. For example, a screw, a latch, or any other suitable fastener may secure the proximal end of the cable track to the inner drawer. Alternatively, the proximal end of the cable track may be formed as an integral part of the inner drawer assembly.

The systems described herein may attach the proximal end of the cable track to the inner drawer assembly directly or indirectly (e.g., via one or more additional components). An example of creating an indirect connection between the proximal end of the cable track and the inner drawer assembly may involve connecting a printed circuit board (such as printed circuit board 195) to the inner drawer assembly and then connecting the proximal end of the cable track to the printed circuit board. Indirect and/or direct connections between the proximal end of the cable track and the inner drawer assembly may also be made in any other suitable manner.

At step 730, the systems described herein may attach a distal end of the cable track (such as distal end 134 of cable track 130) to the outer drawer assembly such that (1) the cable track at least partially folds upon itself as the inner drawer assembly groves from the open position to the closed position and (2) the cable track at least partially unfolds as the inner drawer assembly extends from the closed position to the open position. In other words, the distal end of the cable track may be attached to the outer drawer assembly such that the distal end of the cable track remains stationary while the proximal end of the cable track moves with the inner drawer assembly.

The systems described herein may attach the distal end of the cable track to the outer drawer assembly in any suitable manner. For example, an assembly procedure may involve attaching the distal end of the cable track to the outer drawer assembly with a screw, a latch, and/or a bracket. Alternatively, the distal end of the cable track may be formed as an integral part of the outer drawer assembly.

In some embodiments, attaching the distal end of the cable track to the outer drawer assembly may involve passing all or a portion of the distal end of the cable track through an opening in a back wall of the inner drawer assembly and connecting the distal end of the cable track to the back of the outer drawer assembly. Thus, when the inner drawer assembly is pulled away from the back of the outer drawer assembly, the opening in the back wall of the inner drawer may pass over a middle section of the cable track.

While not shown in FIG. 7, method 700 may involve coupling a proximal end of a cable (e.g., power cable 170) housed within the cable track to a computing component (e.g., printed circuit board 195 and/or storage devices 145) within the inner drawer assembly to provide power or communication to the computing component. The distal end of the cable may be passed through an opening in the inner drawer assembly and may be attached to a connector on the outer drawer assembly or may be passed through an opening in the outer drawer assembly to be connected to another device within a data center.

In addition to coupling the cable to the computing component inside of the inner drawer assembly, method 700 may also involve coupling the cable to the cable track. The systems of the present disclosure may couple the cable to the cable track in a variety of ways. For example, the cable may be run through a channel defined by link segments (e.g., link segments 136a-136n) of the cable track such that the cable track houses at least a portion of the cable. As another example, the cable may be secured to the cable track with one or more clips or brackets.

By housing a cable (or multiple cables) within a cable track, disposed within a data-center drawer, that folds and unfolds upon itself as the data-center drawer closes and opens, the systems and methods described herein may provide various advantages and features over traditional cable-management approaches. For example, using a cable track for cable management within a data-center drawer may protect a cable housed therein from unnecessary wear or accidental disconnection, may keep the cable from getting tangled with other cables or components within a data-center drawer, and may enable efficient and effective maintenance of both the cable and any device connected (or adjacent) to the cable.

The cable-management systems described herein ray also enable simple and efficient installation and removal of data-center drawers. For example, when a technician installs a data-center drawer with internal cabling managed as described herein, the technician may only need to make a single connection (or may not need to manually make any connections if the drawer uses a blind-mate connection) to couple the internal cabling to any external cabling. Furthermore, when a technician removes the data-center drawer, the technician may make a single, simple disconnection without worrying about untangling numerous cables. Embodiments of the instant disclosure may also provide various other safety, maintenance, and aesthetic advantages over traditional cable-management approaches.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A data-center drawer comprising:
   an outer assembly configured to be removably attached to a data-center rack;
   an inner assembly that houses at least one computing component and that is configured to extend between:
   a closed position in which the inner assembly is enclosed within the outer assembly; and
   an open position in which the inner assembly is at least partially extended from the outer assembly; and
   a cable track, positioned within the inner assembly, that is dimensioned to house at least one cable that provides connectivity to the computing component, wherein at least a portion of a distal end of the cable passes through an opening in a back wall of the inner assembly and connects through the back wall to the outer assembly, such that the opening in the back wall of the inner assembly passes over a middle section of the cable track, and wherein the cable track is configured to:
   at least partially fold upon itself as the inner assembly moves from the open position to the closed position; and
   at least partially unfold as the inner assembly extends from the closed position to the open position.

2. The data-center drawer of claim 1, wherein the cable track comprises:
   a plurality of link segments, coupled end-to-end, that together define a channel dimensioned to house the cable;
   a proximal end anchored to the inner assembly; and
   a distal end anchored to the outer assembly.

3. The data-center drawer of claim 2, wherein each link segment is coupled to at least one other link segment via a pivot point.

4. The data-center drawer of claim 2, wherein, when the inner assembly is in the closed position and the cable track is at least partially folded upon itself, at least one link segment of the cable track is vertically superior to at least one other link segment.

5. The data-center drawer of claim 1, wherein the cable track is configured to fold and unfold about a single axis.

6. The data-center drawer of claim 5, wherein the single axis about which the cable track folds and unfolds comprises a horizontal axis that is perpendicular to a horizontal plane along which the inner assembly travels when moving from the closed position to the open position.

7. The data-center drawer of claim 1, wherein the cable housed within the cable track comprises at least one of:
   a power cable that provides power to the computing component housed within the inner assembly;
   a data cable that provides data to the computing component housed within the inner assembly; or
   a grounding cable that grounds the computing component housed within the inner assembly.

8. The data-center drawer of claim 7, wherein the power cable comprises:
   a distal end electrically coupled to a bus bar clip that is attached to the outer assembly; and
   a proximal end electrically coupled to a printed circuit board that is attached to the inner assembly, wherein the printed circuit board electrically couples the computing component housed within the inner assembly to the power cable.

9. The data-center drawer of claim 7, wherein the grounding cable comprises:
   a distal end electrically coupled to the outer assembly via a grounding bolt; and
   a proximal end electrically coupled to a printed circuit board via a grounding screw, wherein the printed circuit board is attached to the inner assembly and electrically couples the computing component housed within the inner assembly to the grounding cable.

10. The data-center drawer of claim 1, wherein the inner assembly comprises:
    a plurality of vertical support walls that together define at least one computing component bay that houses the computing component; and
    a plurality of vertical partition walls that together define a cable track bay that houses the cable track.

11. The data-center drawer of claim 10, wherein:
    the vertical support walls define two lateral computing component bays; and
    the vertical partition walls define a single, medial cable track bay disposed between the two lateral computing component bays.

12. The data-center drawer of claim 1, wherein
    the distal end of the cable is connected to the outer assembly via a bus bar clip.

13. A data-center rack comprising:
    a rack chassis; and
    a drawer assembly inserted into the rack chassis, the drawer assembly comprising:
      an outer assembly removably attached to the rack chassis;
      an inner assembly that houses at least one computing component and that is configured to extend between:
        a closed position in which the inner assembly is enclosed within the outer assembly; and
        an open position in which the inner assembly is at least partially extended from both the outer assembly and the rack chassis; and
      a cable track, positioned within the inner assembly, that is dimensioned to house at least one cable that provides connectivity to the computing component, wherein at least a portion of a distal end of the cable passes through an opening in a back wall of the inner assembly and connects through the back wall to the outer assembly, such that the opening in the back wall of the inner assembly passes over a middle section of the cable track, and wherein the cable track is configured to:
        at least partially fold upon itself as the inner assembly moves from the open position to the closed position; and
        at least partially unfold as the inner assembly extends from the closed position to the open position.

14. The data-center rack of claim 13, wherein the cable track comprises:
    a plurality of link segments, coupled end-to-end, that together define a channel dimensioned to house the cable;
    a proximal end anchored to the inner assembly; and
    a distal end anchored to the outer assembly.

15. The data-center rack of claim 14, wherein, when the inner assembly is in the closed position and the cable track is at least partially folded upon itself, at least one link segment of the cable track is vertically superior to at least one other link segment.

16. The data-center rack of claim 14, wherein the cable track is configured to fold and unfold about a single axis.

17. The data-center rack of claim 16, wherein the single axis about which the cable track folds and unfolds comprises a horizontal axis that is perpendicular to a horizontal plane along which the inner assembly travels when moving from the closed position to the open position.

18. The data-center rack of claim 13, wherein the cable housed within the cable track comprises at least one of:
    a power cable that provides power to the computing component housed within the inner assembly;
    a data cable that provides data to the computing component housed within the inner assembly; or
    a grounding cable that grounds the computing component housed within the inner assembly.

19. The data-center rack of claim 13, wherein the inner assembly comprises:
    a plurality of vertical support walls that together define at least one computing component bay that houses the computing component; and
    a plurality of vertical partition walls that together define a cable track bay that houses the cable track.

20. A method comprising:
    attaching an inner drawer assembly to an outer drawer assembly that is configured to be removably attached to a data-center rack, wherein the inner drawer assembly houses at least one computing component and is configured to extend between:
  a closed position in which the inner drawer assembly is enclosed within the outer drawer assembly; and
  an open position in which the inner drawer assembly is at least partially extended from both the outer drawer assembly and the data-center rack;
attaching a proximal end of a cable track to the inner drawer assembly; and
attaching a distal end of the cable track to the outer drawer assembly, wherein the cable track is dimensioned to house at least one cable that provides connectivity to the computing component, wherein at least a portion of a distal end of the cable passes through an opening in a back wall of the inner drawer assembly and connects through the back wall to the outer drawer assembly, such that the opening in the back wall of the inner drawer assembly passes over a middle section of the cable track, and is configured to:
  at least partially fold upon itself as the inner drawer assembly moves from the open position to the closed position; and
  at least partially unfold as the inner drawer assembly extends from the closed position to the open position.

\* \* \* \* \*

UNITED STATES PATENT AND TRADEMARK OFFICE
CERTIFICATE OF CORRECTION

PATENT NO. : 10,165,703 B1  
APPLICATION NO. : 15/720647  
DATED : December 25, 2018  
INVENTOR(S) : Jason David Adrian Page 1 of 1

It is certified that error appears in the above-identified patent and that said Letters Patent is hereby corrected as shown below:

On the Title Page

In Column 2, item (57), Abstract, Line 1, delete "outerassembly" and insert -- outer assembly --, therefor.

Signed and Sealed this  
Twenty-sixth Day of February, 2019

Andrei Iancu  
*Director of the United States Patent and Trademark Office*